United States Patent [19]
Khayrallah et al.

[11] Patent Number: 6,035,007
[45] Date of Patent: Mar. 7, 2000

[54] EFFECTIVE BYPASS OF ERROR CONTROL DECODER IN A DIGITAL RADIO SYSTEM

[75] Inventors: Ali S. Khayrallah, Apex; Raymond Toy; Rajaram Ramesh, both of Cary, all of N.C.

[73] Assignee: Ericsson Inc., Research Triangle Park, N.C.

[21] Appl. No.: 08/614,317

[22] Filed: Mar. 12, 1996

[51] Int. Cl.⁷ .............................. H04L 27/06; G06F 11/10
[52] U.S. Cl. .......................................... 375/341; 371/43.6
[58] Field of Search .................................. 375/341, 262; 371/43.1, 43.6, 43.7

[56] References Cited

U.S. PATENT DOCUMENTS

| | | |
|---|---|---|
| 4,261,054 | 4/1981 | Scharla-Nielsen . |
| 4,404,674 | 9/1983 | Rhodes ..................................... 371/43 |
| 5,073,940 | 12/1991 | Zinser et al. . |
| 5,081,681 | 1/1992 | Hardwick et al. . |
| 5,097,507 | 3/1992 | Zinser et al. . |
| 5,111,483 | 5/1992 | Serfaty . |
| 5,177,740 | 1/1993 | Toy et al. . |
| 5,195,166 | 3/1993 | Hardwick et al. . |
| 5,216,747 | 6/1993 | Hardwick et al. . |
| 5,226,084 | 7/1993 | Hardwick et al. . |
| 5,226,108 | 7/1993 | Hardwick et al. . |
| 5,247,579 | 9/1993 | Hardwick et al. . |
| 5,278,871 | 1/1994 | Rasky et al. . |
| 5,285,480 | 2/1994 | Chennakeshu et al. . |
| 5,311,553 | 5/1994 | Chennakeshu et al. . |
| 5,321,705 | 6/1994 | Gould et al. . |
| 5,343,498 | 8/1994 | Toy et al. . |
| 5,349,589 | 9/1994 | Chennakeshu et al. . |
| 5,351,249 | 9/1994 | Lomp et al. . |
| 5,351,274 | 9/1994 | Chennakeshu et al. . |
| 5,363,407 | 11/1994 | Ramesh et al. . |
| 5,371,471 | 12/1994 | Chennakeshu et al. . |
| 5,390,215 | 2/1995 | Antia et al. . |
| 5,400,362 | 3/1995 | Chennakeshu et al. . |
| 5,406,593 | 4/1995 | Chennakeshu et al. . |
| 5,414,738 | 5/1995 | Bienz . |
| 5,416,804 | 5/1995 | Khaled et al. . |
| 5,425,037 | 6/1995 | Uesugi et al. . |
| 5,430,743 | 7/1995 | Marturano et al. ...................... 371/43 |
| 5,432,778 | 7/1995 | Minde et al. ........................... 375/343 |
| 5,434,886 | 7/1995 | Kazawa et al. . |
| 5,467,374 | 11/1995 | Chennakeshu et al. . |
| 5,559,757 | 9/1996 | Catipovic et al. ...................... 367/134 |

FOREIGN PATENT DOCUMENTS

| | | |
|---|---|---|
| 1293012 | 11/1989 | Japan . |
| 3198545 | 8/1991 | Japan . |
| 5235784 | 9/1993 | Japan . |
| WO83/02344 | 7/1983 | WIPO . |
| WO93/12598 | 6/1993 | WIPO . |

OTHER PUBLICATIONS

Sklar, *Digital Communications, Fundamentals and Applications*, pp. 269–280, 327–331 published by Prentice Hall, Inc. (1988).

*Primary Examiner*—Don N. Vo
*Assistant Examiner*—Albert Park
*Attorney, Agent, or Firm*—Nixon & Vanderhye P.C.

[57] ABSTRACT

A digital radio communications system including a suboptimal soft decision (e.g., errors and erasures) channel decoder and a speech decoder can be upgraded to effectively bypass the hard decision channel decoder and allow a higher performance soft decision (e.g., maximum likelihood sequence estimate (MLSE)) decoder to be used—without requiring physical removal or disconnection of the hard decision channel decoder. The new decoder can feed the existing decoder the right choice of received vector r' to force the existing decoder to produce a certain codeword y' and a certain bit error estimate b'. This technique is useful to test new MLSE decoders on existing radios, or to add an MLSE decoder as an upgrade on existing receivers.

24 Claims, 6 Drawing Sheets

EFFECTIVE BYPASS OF ERROR CONTROL DECODER IN A DIGITAL RADIO SYSTEM

FIELD OF THE INVENTION

This invention relates to improved communication system decoding arrangements, and more particularly to digital channel decoding within land mobile radio receivers. Still more specifically, this invention provides a technique for adding a high performance (e.g., maximum likelihood sequence estimation MLSE) channel decoder to a radio system having an existing lower performance channel decoder without requiring removal or disconnection of the existing decoder, by forcing the output of the existing decoder to be that of the high performance decoder.

BACKGROUND AND SUMMARY OF THE INVENTION

Public safety specialists such as police officers, firemen and ambulance operators rely extensively on land mobile radio systems to provide prompt and reliable radio communications. Reliability is especially important since a failed communication can literally mean the difference between life and death in critical public safety scenarios.

Various effects can degrade the reliability of radio communications to result in garbled communications. Noise and fading are always present on a communication channel. There is also a possibility that another transmitter operating at or near the same frequency can cause interference. Such channel impairments can adversely affect communications reliability and intelligibility.

Radio designers use various techniques to increase communications reliability despite channel impairments such as noise, fading and interference. "Channel coding" is one such well known technique. Channel coding refers to a class of signal transformations designed to improve communications performance by enabling transmitted signals to withstand better the effects of channel impairments. Usually, the goal of channel coding is to reduce the probability of transmission errors by enhancing the ability of the receiver's detection process to distinguish between the different symbols. The detection process at the receiver thus can better detect and correct errors introduced by channel impairments. Reducing such errors increases reliability, clarity and intelligibility.

FIG. 1 shows one simplified example of general overall arrangements within an example digital land mobile radio transceiver system 50 that uses channel coding techniques to increase signal transmission reliability. To transmit using system 50, the radio operator talks into microphone 52. Voice signals from microphone 52 are amplified (and filtered) by a speech amplifier block 54. These signals are then sampled (i.e., converted into digitized speech bits) by an analog-to-digital converter 55, and processed by a speech encode block 56. Speech encode block 56 may, for example, use conventional "vocoding" techniques to "compress" the digital representation of the speech and reduce the radio bandwidth required for transmission. A channel encoder block 58 takes the "vocoded" digitized speech signals and further processes them (e.g., by adding redundancy) to provide enhanced error detection and correction capability as described above. Modulator block 60 impresses the coded digital signals onto a radio frequency (RF) carrier signal. The modulated RF carrier may (after appropriate up-conversion to an operating frequency as necessary by a frequency select process 61) be amplified by an RF power amplifier 62 and applied to an antenna 66 via a "T/R" (transmit-receive) switch 64 (or other conventional arrangement such as a duplexer). Antenna 66 transmits the modulated RF signal over the air to a distantly located receiving station (e.g., a repeater or a base station).

To receive signals, radio system 50 passes the signals from the antenna 66 through the T/R switch 64 to an RF amplifier block 68. RF amplifier block 68 amplifies the weak antenna signals, and frequency selection process 69 (e.g., conventional down-conversion and further intermediate frequency or other filtering) selects the particular received signal of interest. Demodulator 70 recovers the coded digital bit stream from the RF carrier. The receiver's channel decode block 72 detects and corrects errors in the demodulated signal (based on the particular channel coding employed by channel encode block 58), and outputs a recovered, error-corrected digital bit stream plus a reliability estimate. Speech decode block 74 performs an operation inverse to the operation performed by the transmitter's speech encode block 56 (e.g., "expanding" the digitized speech representation) to recover digitized speech based on the channel-decoded data and the reliability estimate. This digitized speech is converted back into an analog signal by a digital-to-analog conversion process 75, amplified by audio amplifier 76, and reproduced as sound by loudspeaker 78.

There are many types of channel coding techniques that a designer might choose to use in radio system 50 for channel encode block 58 and channel decode block 72. See, for example, Sklar, *Digital Communications* (Prentice Hall 1988), pages 245–380 for a representative survey. Channel coding technique selection usually represents a tradeoff between performance and complexity. More complex channel coding techniques can offer increased performance at the cost of increased complexity. Since it is usually important to make portable and mobile radios simple, small and inexpensive, radio designers may not always have the luxury of choosing the highest performance channel coding or decoding techniques available.

One basic complexity and performance characteristic of a channel decoder relates to whether the decoder makes "soft" or "hard" decisions. Of course, radios generally need to at least eventually make a "hard" or firm decision identifying each received symbol—since the radio's audio processing circuits need a definitive signal as opposed to an output saying "I don't know" or "I'm not sure." However, the stage at which this "hard" decision is made is an important factor in determining the complexity of the channel decoder. For less complex channel decoders, a "hard" decision (e.g., "I received a 0 bit" or "I received a 1 bit") is made at a relatively early stage (e.g., at the demodulator's output). More complex channel decoders replace this "hard" decision with a "soft" decision (e.g., 8 different levels) that provides additional information (e.g., a "measure of confidence" reliability estimate). The idea behind soft decisions is to provide the channel decoder with more information, which the decoder then uses for recovering the message sequence with better performance (e.g., using maximum likelihood sequence estimate decoding techniques) than is achievable using hard-decision decoding. But, since a soft-decision decoder needs to store and process much more data, it provides this increased performance only at the cost of significantly greater complexity.

Work has also been done in the past to make the speech coding process less susceptible to bit errors. It has been recognized that error rate estimates can be used to increase speech decoder performance. See, for example, U.S. Pat. No. 5,247,579 to Hardwick, which describes an improved multiband excitation (IMBE) speech coder system that uses error correction estimated error rates and to improve speech decoding by repeating speech decoding quantized model parameters when the error rate exceeds a predetermined level.

A particular channel and speech coding/decoding technique that represents an acceptable cost-performance tradeoff for some mobile radio applications is the IMBE speech coder and error control code (ECC) technology developed by Digital Voice Systems, Inc. (DVSI) of Burlington Massachusetts and licensed by Ericsson Inc. for use in Ericsson's PRISM TDMA and narrowband land mobile radio products. This particular technology employs a channel decoder that is a "hybrid" between a soft-decision decoder and a hard-decision decoder. Briefly, DVSI's design provides "errors and erasures" channel decoding based on a "hard" decision, and generates a reliability estimate for use in a subsequent speech decoder process.

FIG. 2 shows a simplified block diagram of DVSI's IMBE decoder module 100, which includes a channel coder/decoder 72A and a speech coder/decoder 74A within a single integrated unit such as a VLSI integrated circuit chip or plug-in board. In this design, the bit stream output r of the receiver's demodulator 70A is provided to the input of decoder module 100. Within decoder module 100, the channel decoder 72A generates a set of decoded codewords y and a reliability estimate RE that it provides to speech decoder 74A. Speech decoder 74A uses both the codeword output r and the reliability estimate RE to decode and reconstruct the digitized voice bit stream DV which it outputs for further audio processing (e.g., digital-to-analog conversion and analog audio amplification).

FIG. 2A shows a simplified flowchart of the process performed by the FIG. 2 channel decoder 72A. The process receives the input r (the received vector produced by the demodulator 70A). Each component $r_i$ in this vector r is an integer between 0 and $(2^m-1)$, where m is the number of soft decision bits. The process first produces z, a hard decision version of r, using a threshold of $(2^{m-1}-1)/2$ (block 102). The process also identifies t locations where $r_i$ is closest to the threshold—the quantity t being the decoding radius of the code (e.g., t=1 for a Hamming code) (block 104). The process next erases the bits from z corresponding to the t locations (i.e., the t most unreliable bits) (block 106); and creates $2^t$ vectors $z^{(j)}$, all with the unerased bits of z, and each with a different combination replacing the erased bits (block 108). The $z^{(j)}$ vectors are then decoded, producing $2^t$ codewords $y^{(j)}$ (block 110). The process selects the final codeword choice from among these codewords $y^{(j)}$, the final codeword choice being such that $(2^m-1)y^{(j)}$ is closest to r in Euclidean distance (block 112). The process also produces the Hamming weight b of the error pattern e=z-y as a reliability estimate for y (block 114). The process outputs these resulting selected codewords and an associated reliability indicator to the speech decoder 74A—which makes use of both types of data in the speech decoding process it performs.

Hamming weight and Euclidean distance referred to above are well known techniques for quantifying the relevant distance between code vectors. Euclidean distance is a common geometrical quantity that takes into account the directions of vectors in multi-dimensional space. In coding contexts, Euclidean distance is commonly used in soft decision decoding to choose, based on probabilities, an output codeword that is "closest" (in multi-dimensional code space) to the received input vector. Euclidean distance can be determined by computing the inner ("dot") product between the two vectors. For example, a soft decision decoder may choose a codeword $U^{(m')}$ if it maximizes $$\sum_{i=1}^{\infty}\sum_{j=1}^{\infty} Z_{ji} U_{ji}^{(m)} \tag{1}$$

where Z is the received vector or pattern (sequence) comprising elements $z_{i,j}$, and $U^{(m)}$ is the output codeword sequence. This technique chooses the codeword $U^{(m')}$ that is closest in Euclidean distance to the received sequence.

Hamming weight is based on Hamming distance -- another, less complex measure of coding distance. The Hamming distance between two code vectors is defined to be the number of elements in which they differ. Thus, the Hamming weight of an error pattern is equal to its Hamming distance from the all-zeros vector—and hence is simply the number of non-zero elements in the pattern (i.e., the number of ones in a binary vector).

Although the FIG. 2 arrangement may represent one acceptable cost-performance tradeoff, it suffers from a disadvantage in that its IMBE channel decoder 72A makes only partial use of the soft information available to it. A different type of channel decoder, known as a "maximum likelihood sequence estimation" (MLSE) decoder, is the optimal soft decision decoder under certain conditions. Low complexity implementations (e.g., trellis decoders) have recently been developed that make it possible to perform MLSE decoding more efficiently. Such low complexity implementations may be very suitable for base stations and radio repeaters—where additional channel coder complexity may be justified because of the increased performance (e.g., reduced speech garbling) it can offer. It therefore seems attractive to substitute a MLSE decoder arrangement for the IMBE ECC decoder 72A shown in FIG. 2 (e.g., as an optional feature, an add on or a retrofit) in at least some applications.

Unfortunately, the closely integrated design of the FIG. 2 example decoder module 100 makes it impossible to simply "swap out" or physically bypass the existing decoder 72A without also bypassing the associated speech decoder 74A. Module 100 may be designed (e.g., for reduced pin out or for other reasons) such that the inputs to speech decoder 74A are not conveniently accessible to the outside world. Moreover, there may be a close integration between channel decoder 72A and speech decoder 74A due to the speech decoder's use of the channel decoder's particular error rate estimate—making it difficult or impossible to use the speech decoder without also using its associated channel decoder. Thus, the only practical way to use speech decoder 74A may be in conjunction with existing IMBE channel decoder 72A. Total redesign and replacement of the entire module 100 to provide both a new channel decoder and a new speech decoder may not be cost effective, and in any event would be extremely difficult or impossible in the case of trying to retrofit or upgrade an already manufactured radio.

We have discovered a technique for effectively bypassing the existing channel decoder 72A without requiring it to be physically removed or disconnected from the radio system 50. Briefly, we effectively bypass the existing decoder 72A by feeding it information generated through use of an additional, higher performance (e.g., MLSE) decoder. This higher performance decoder may, for example, use a maximum likelihood sequence estimation (MLSE) channel decoding technique. The additional information forces the existing decoder to produce outputs corresponding to the higher performance decoder's outputs. To do this, we break the connection between the demodulator 70A output and the existing channel decoder 72A, and insert the additional, high performance decoder between the demodulator's output and the existing decoder's input.

The MLSE decoder in this example produces a sequence of error-corrected estimated codewords and an error pattern estimate. In accordance with one aspect of our invention, we use the MLSE decoder's error pattern estimate to—under at least some conditions—generate artificial errors that effectively "fool" the existing decoder into providing an appropriate error estimate to the speech decoder. This allows the speech decoder to operate based on an accurate error estimate—even though the error estimate may take into account errors that the existing decoder is incapable of correcting itself!

We can selectively insert these artificial errors into the error-corrected output of the MLSE decoder. These artificially-introduced errors are of a type and nature that they can be reliably detected and corrected by the existing decoder 72A. Moreover, these artificial errors are specified so that the reliability estimate produced by the existing decoder 72A will be forced to match—as closely as possible given the limitations of the existing decoder—the error pattern estimate produced by the higher performance decoder.

Thus, in accordance with techniques provided by this invention, the existing IMBE decoder 72A transforms its input into an exact replica of the higher performance decoder's codeword output (before introduction of artificial errors)—and also produces a reliability estimate that matches (within the constraints of the existing decoder) the error pattern estimate of the higher performance decoder. Hence, the existing decoder 72A is effectively bypassed or made "transparent"—allowing the higher performance decoder's output (both decoded codewords and error pattern estimate) to effectively be fed to the input of speech decoder 74A.

Our technique can be used, for example, for testing new MLSE decoders on the current platform, or to add an MLSE decoder as an upgrade on existing receivers.

BRIEF DESCRIPTION OF THE DRAWINGS

These and other features and advantages of the invention may be better and more completely understood by referring to the following detailed description of presently preferred example embodiments in conjunction with the drawings, of which.

DETAILED DESCRIPTION OF EXAMPLE EMBODIMENTS

Figure 2:
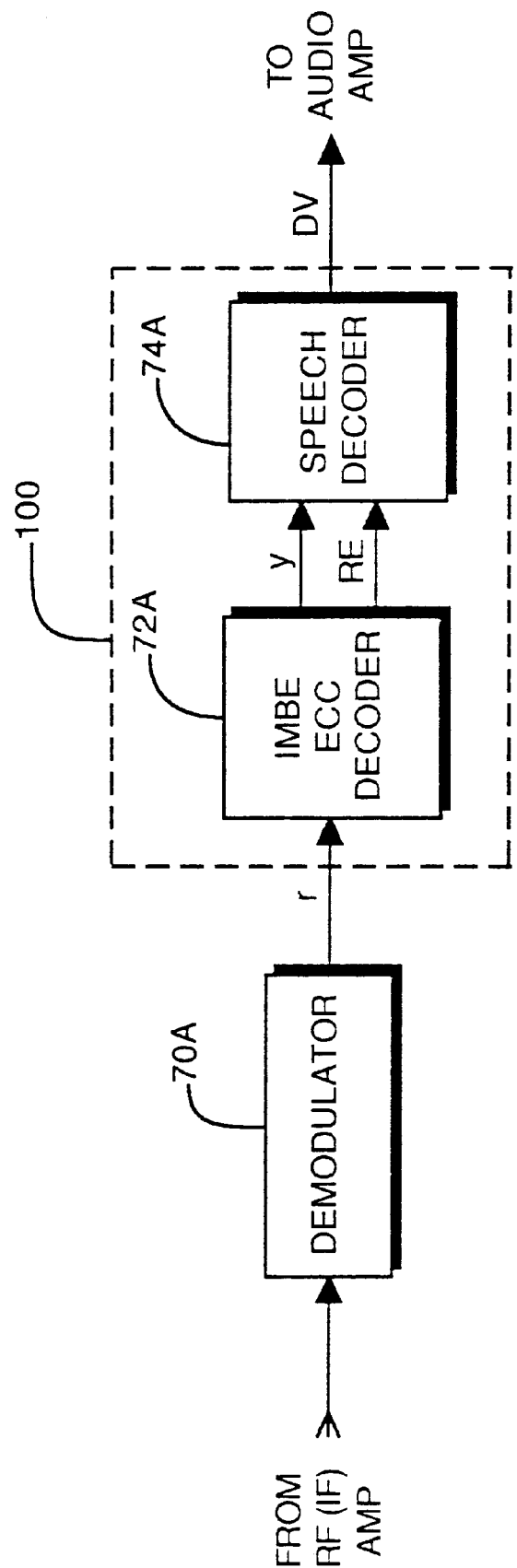
FIG. 2 shows example receiver demodulator, channel decoder and speech decoder circuits.
Figure 2A:
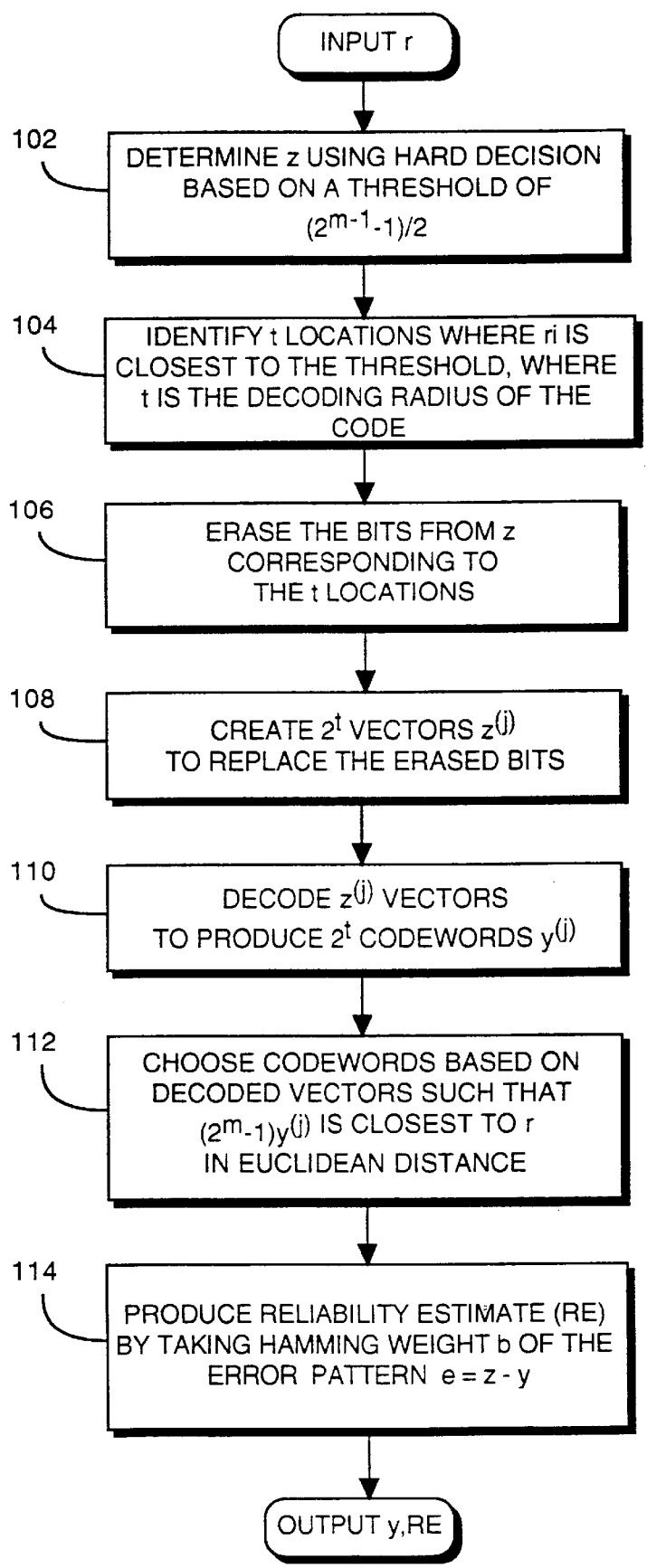
FIG. 2a shows an example channel decoding process performed by the FIG. 2 channel decoder.
Figure 3:
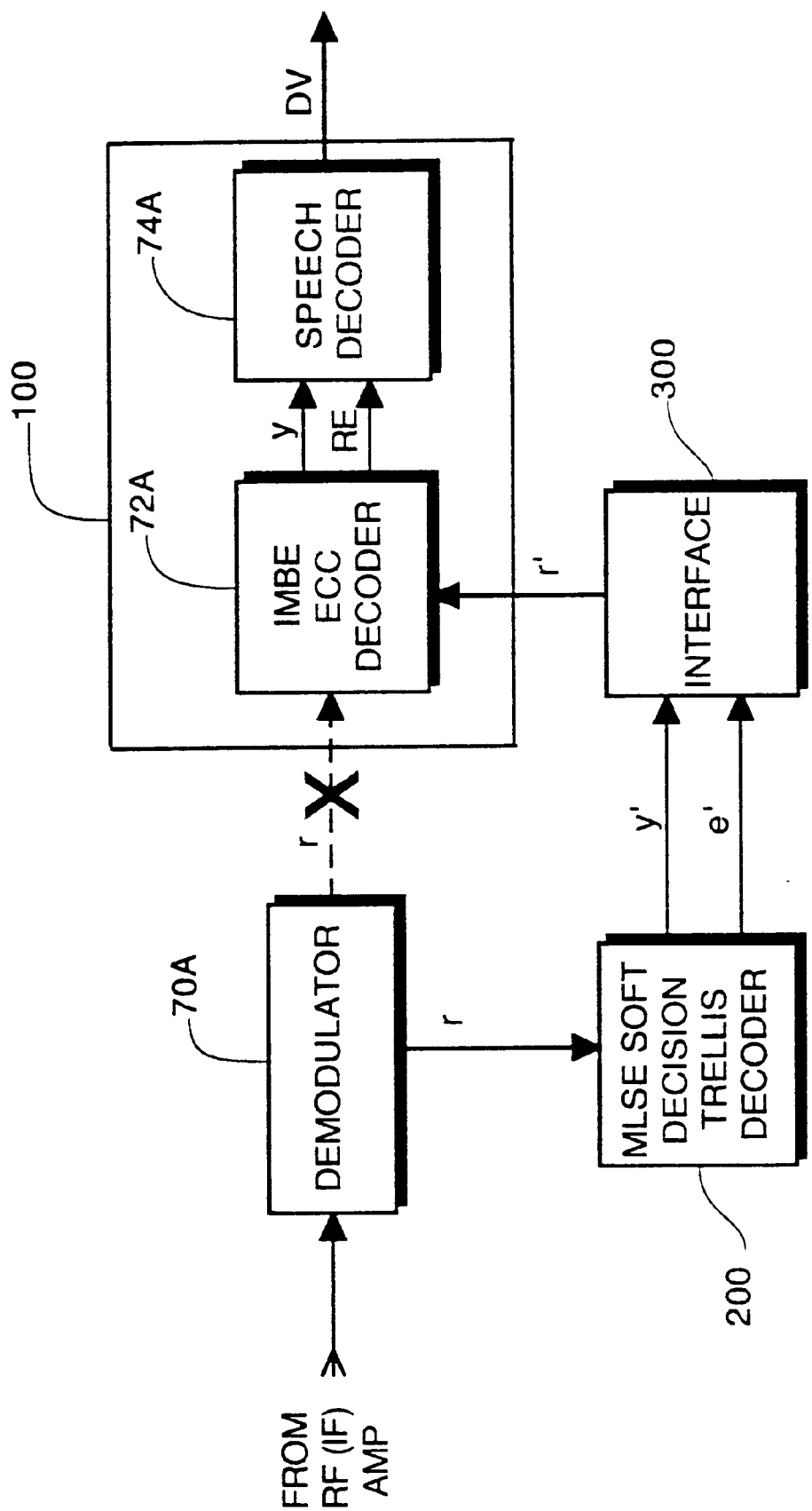
FIG. 3 shows an example embodiment provided by the present invention using a higher performance maximum likelihood sequence estimate (MLSE) decoder to effectively bypass the existing channel decoder of FIG. 2 while allowing continued use of the speech decoder.

FIG. 3 shows an example embodiment of radio demodulator and decoder circuitry provided by the present invention. The arrangement shown in FIG. 3 may be employed in the radio transceiver system 50 of FIG. 1, for example. Comparing FIG. 2 with FIG. 3, it can be seen that the FIG. 2 connection between the output of demodulator 70A and the input of existing ME channel decoder 72A has been broken and replaced by an add-on or retrofit signal path comprising a high performance decoder 200 and an interface 300.

In this example, the output of demodulator 70A (vector r) is provided to the input of high performance decoder 200. High performance decoder 200 performs error detection and correction in accordance with some algorithm (e.g., maximum likelihood sequence estimate (MLSE) based on an efficient implementation using a trellis for example). The estimated codeword output y' of high performance decoder 200 is, in this specific example, applied (along with other values) to an interface 300. Interface 300 (which may be considered an output device for outputting data to the existing decoder 72A) selectively introduces artificial errors into the estimated codewords y' outputted by high performance decoder 200, and applies the estimated codeword output stream with these intentionally introduced artificial errors as a vector r' to the input of existing decoder 72A. Existing decoder 72A decodes the r' vector to detect and correct the intentionally inserted artificial errors-producing codewords y that are an exact replica of the estimated codewords y' output of higher performance decoder 200. In addition, the reliability estimate RE produced by existing decoder 72A depends on the number of errors artificially introduced into r' by interface 300. Thus, interface 300 can introduce an appropriate number of artificial errors into the r' vector to force the existing decoder 72A to produce a reliability estimate RE that matches (within the constraints of the existing decoder) the error pattern estimate e' produced by higher performance decoder 200—while still allowing the higher performance decoder to correct errors the existing decoder is incapable of correcting.

In accordance with this FIG. 3 embodiment, interface 300 applies a transformation to codewords y' that is the inverse of the transformation the existing decoder 72A applies to its input. On a more simplistic level, the processing done by interface 300 is completely "undone" or reversed by existing decoder 72A—so that interface 300 effectively "cancels out" or bypasses existing decoder 72A.

The net overall effect is to effectively connect the output of high performance channel decoder 200 to the input of speech decoder 74A—without requiring existing channel decoder 72A to be physically removed or disconnected and without requiring the inputs of speech decoder 74A to be directly accessed or connected to by circuits 200, 300 external to decoder module 100.

In this example, blocks 200, 300 may be implemented using an appropriately programmed digital signal processor (DSP) integrated circuit chip, if desired. Alternatively, it may be desirable to implement blocks 200, 300 with high speed sequential logic such as a gate array—or with a combination of a programmed processor and dedicated logic. In one specific embodiment, the output wire or conductive pathway that connects the output of demodulator 78 to the input of module 100 may be physically cut or broken—with additional blocks 200, 300 used to bridge over the broken connection. Thus, the apparent depiction in FIG. 3 of a demodulator 70A having two different outputs (one cut and one not) and an existing decoder 72A having two inputs (one cut and one not) is not necessary but rather is shown for purposes of illustration only.

Figure 4:
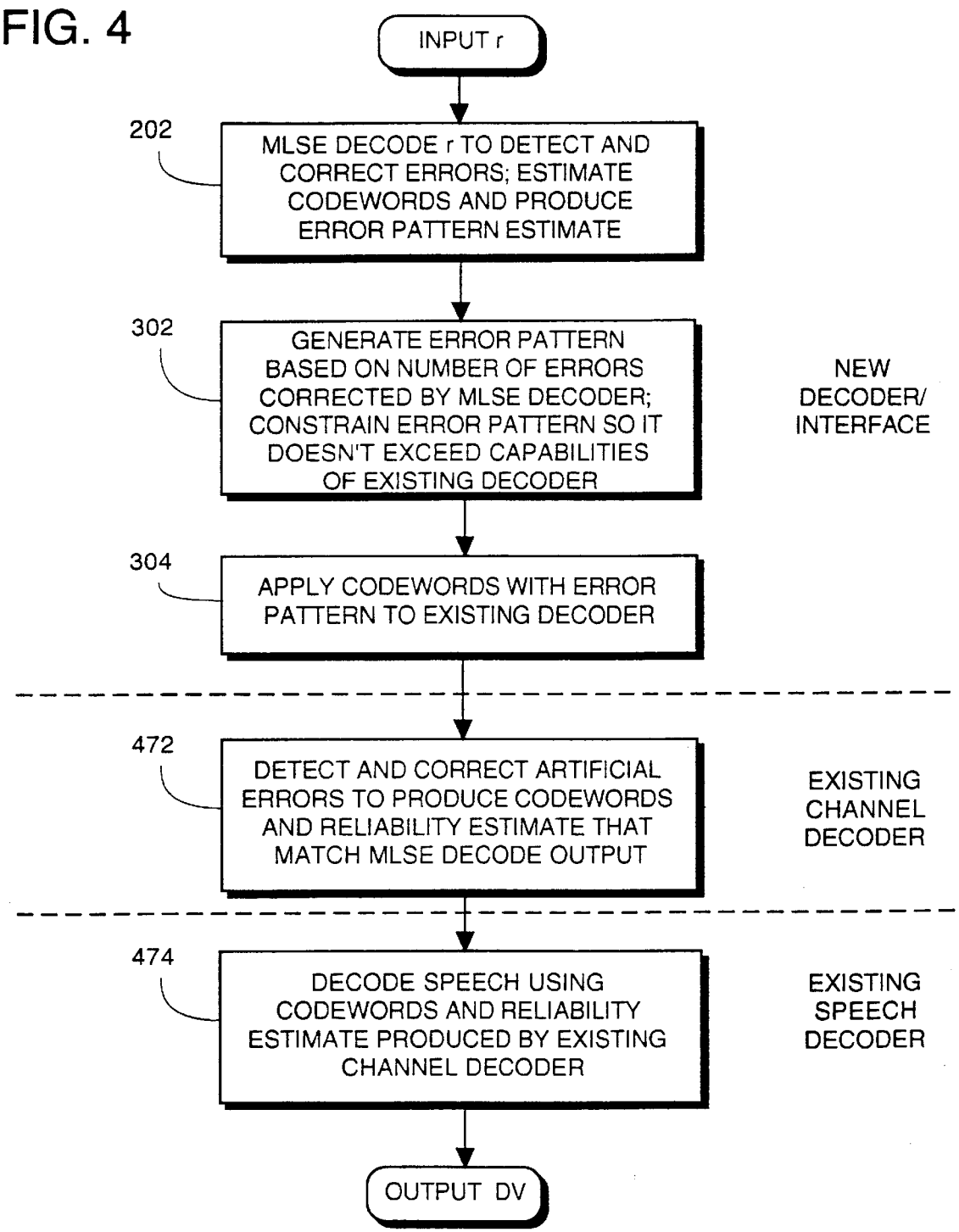
FIG. 4 is a simplified flowchart of steps performed by the FIG. 3 embodiment.

FIG. 4 shows a simplified flowchart of example steps performed by decoder 200, interface 300 and existing decoder 72A of FIG. 3. In the FIG. 4 example, block 202 may be performed by the additional high performance decoder 200; blocks 302, 304 may be performed by interface 300; block 472 is performed by existing decoder 72A; and block 474 is performed by the existing speech decoder 74A. More particularly, the demodulated output r of demodulator 70A is decoded by high performance decoder 200 using conventional MLSE decoding techniques to detect and correct errors (block 202). High performance decoder 200 estimates the error-corrected codewords (y'), and also produces an error pattern estimate (e') that indicates the number of errors the high performance decoder has corrected. These values are outputted in this specific example to interface 300.

Interface 300 in this example generates an error pattern based on the number of errors corrected by MLSE decoder 200 (block 302). Such error pattern generation may in one specific embodiment comprise simply allowing—under certain conditions—the uncorrected bit stream to pass to the existing decoder 72A for error correction and detection (block 304)—but only after high performance decoder 200 has detected and identified the errors and interface 300 analyzes the errors to confirm that the existing decoder is capable of correcting the detected errors. This process thus has the effect of constraining the error patterns fed to the existing decoder to only those error patterns the existing decoder is capable of correcting (block 302).

Since the high performance MLSE decoder 200 is capable of correcting more errors than the existing decoder 72A can in this example, there exists the possibility that the high performance decoder has corrected errors the existing decoder is incapable of correcting (indeed, this is the reason why one wants to employ the high performance decoder 200 in the first place). In at least such cases, interface 300 may generate an artificial error pattern that does not directly correspond to the errors actually encountered (which the existing decoder couldn't correct) but are instead of a type the existing decoder can successfully detect and correct. Moreover, in this example, interface 300 selects an artificial error pattern that will force the existing decoder 72A to output a reliability estimate RE that has a close correspondence with the error estimate produced by the high performance decoder 200. In this way, speech decoder 74A will have the benefit of at least an approximately accurate reliability estimate—and will also receive a fully corrected codeword. To accomplish this, interface 300 may insert the constrained artificial error pattern into the codewords y' estimated by MLSE decoder 200, and feed the resulting codewords with intentionally introduced errors as a vector r' to the input of existing decoder 72A (block 304).

Figure 1:
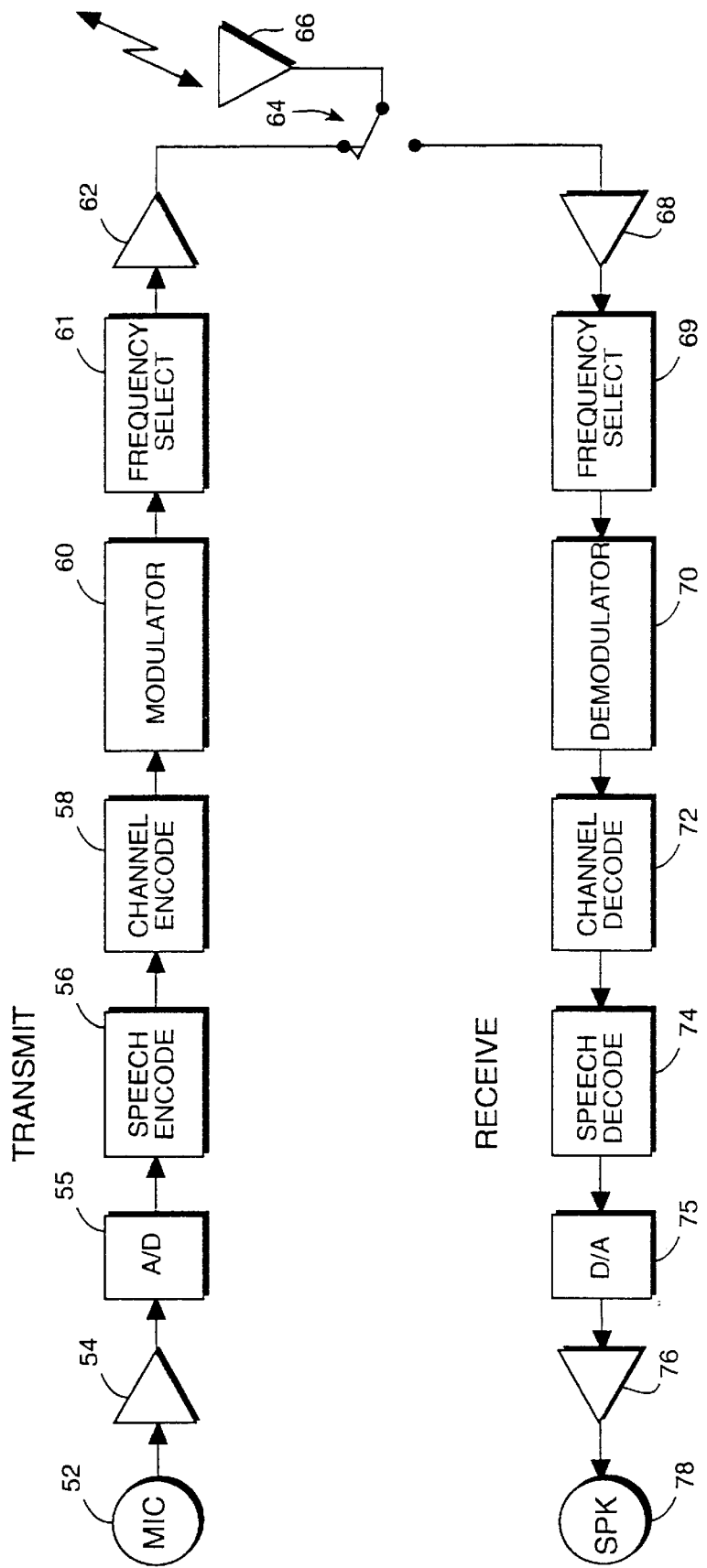
FIG. 1 shows an example digital radio transceiver employing channel coding to increase transmission reliability.

Existing decoder 72A detects and corrects the errors within the pseudo received vector r' supplied to it. It produces error-corrected codewords y and associated reliability estimates RE. In this example, the codewords outputted by existing decoder 72A match the codewords outputted by high performance MLSE decoder 200 (i.e., y=y'). In addition, the reliability estimate RE produced by existing decoder 72A matches—within the constraints of the error correction capabilities of the existing decoder—the error estimate e' produced by high performance MLSE decoder 200 (block 472). Existing decoder 72A outputs the codewords y and a reliability estimate RE for use by speech decoder 74A in reliably expanding the codewords into recovered digitized speech (DV) (block 474). This digitized speech is output for further processing as shown in FIG. 1, for example.

In a more detailed embodiment, the steps of FIG. 4 can be implemented as follows:

1. The demodulator output r is hard limited to produce a binary vector z'.
2. The MLSE decoder is fed r and outputs codeword estimate y'.
3. The error pattern estimate is e'=z'−y'.
4. The number of errors estimate is b', the Hamming weight of e' (see previous description of Hamming weight).
5. If e' is a "coset leader" (see discussion that follows) for the existing detector, let r'=$(2^m-1)$z'. Otherwise reset e' to be a coset leader with the largest possible weight ≦b'. reset z=y'+e', and let r'=$(2^m-1)$z'.
6. The artificial demodulator output r' is fed to the existing decoder.

Figure 5:
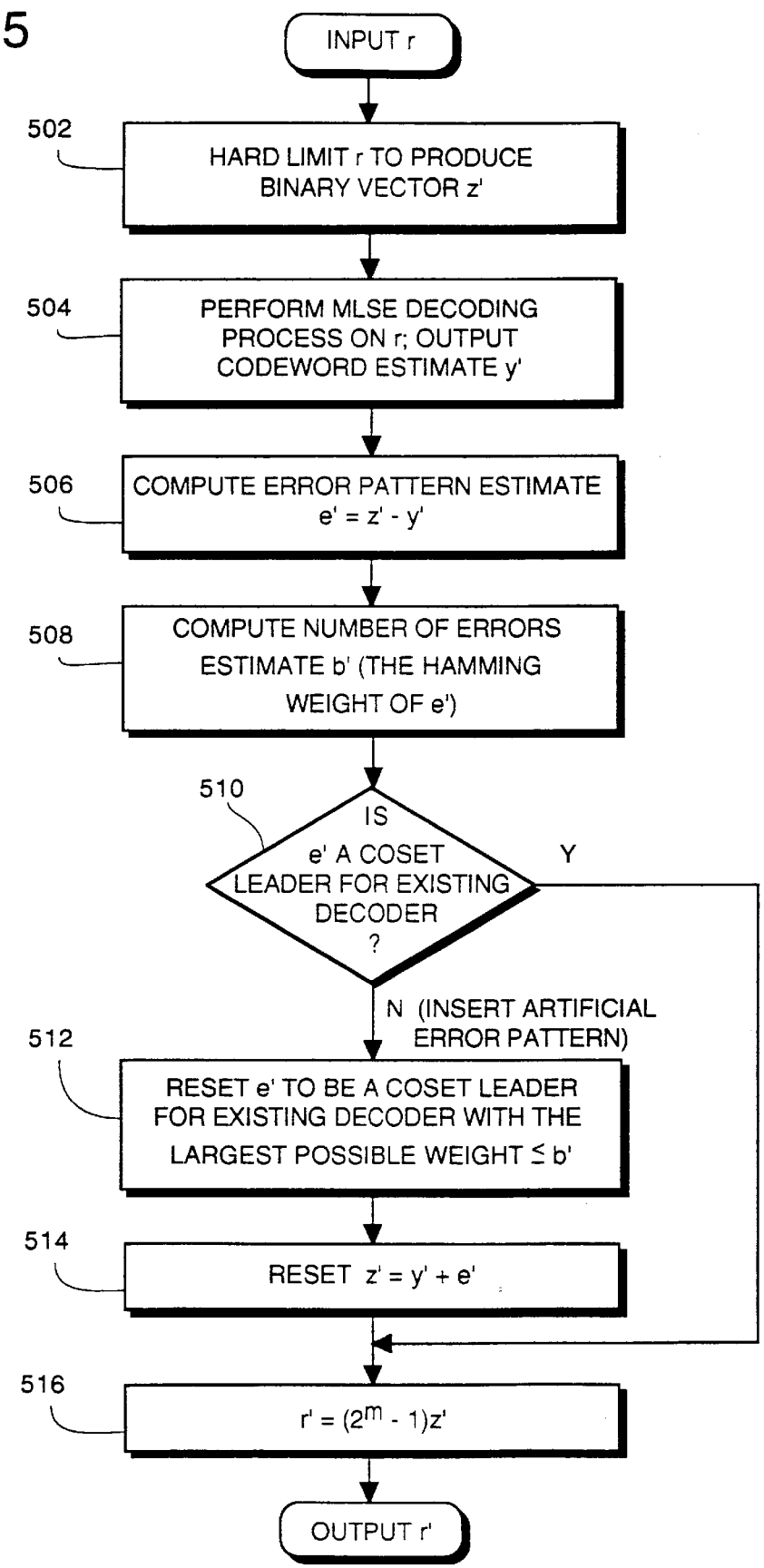
FIG. 5 is a flowchart of more detailed and/or alternate steps that may be performed by the FIG. 3 embodiment.

FIG. 5 shows a more detailed example of the steps performed by MLSE decoder 200 and interface 300 (which in one specific embodiment may be implemented by a single digital signal processor chip under software control). In the FIG. 5 example, the demodulator 70A output r is first hard limited to produce a binary vector z' (block 502). A conventional MLSE decoding algorithm is fed the original demodulator output r, performs MLSE decoding on this demodulator output r, and outputs a codeword estimate y' (block 504).

The process then computes an error pattern estimate e' indicating the difference between the hard-limited binary vector z' and the MLSE-decoded codeword estimate y', i.e.,:

$$e'=z'-y'$$

(block 506). This error pattern estimate is an indicator of the number or amount of errors corrected by the MLSE decoding process of block 504. Block 508 uses this error pattern estimate e' to compute the number of errors estimate b' (where b' is the Hamming weight of e'). Thus, in this example we use e'=z'−y' as an estimate for the error pattern, and its Hamming weight b' as an estimate of the number of bit errors.

These estimates e' and b' are a little tricky. The existing decoder 72A uses a complete decoder, and we assume that we know all the coset leaders (CL; see below), i.e., all the error patterns it is capable of correcting. However, the soft decision decoder 200 can produce an e' that is not a coset leader of the existing decoder 72A—i.e., it can correct an error that the existing decoder is incapable of correcting. The soft decision decoder 200 can also produce a b'>t (where t is the decoding radius of the code applied by a transmitter IMBE coder)—although for the perfect (23, 12) and (15, 11) codes the soft decision decoder always produces an estimate b'≦t.

In one embodiment, the errors estimate b' can be clamped to be no greater than the number of errors correctable by existing decoder 72A, and this clamped error estimate is then used in all cases to generate an artificial error pattern for insertion into the codeword estimate y' outputted by soft decision decoder 200 to produce the r' artificial demodulated vector for application to the existing decoder 72A.

In accordance with another, somewhat more complex example arrangement, we construct an artificial received vector r' to be fed to the existing decoder 72A by processing the two cases of error pattern differently—as represented by the two branches of a decision block 510 and as described below.

Case 1: e' is a coset leader and is therefore correctable by existing decoder 72A.

In this more complex embodiment shown in FIG. 5, decision block 510 determines whether the error pattern estimate e' is a "coset leader" for existing decoder 72A. Irrespective of how existing decoder 72A is actually implemented, it is possible to model the existing decoder 72A as using a "standard array" that arranges the $2^n$ n-tuples that represent possible received vectors such that the first row contains all the code vectors starting with the all-zeros vector and the first column contains all the correctable error patterns. In the case of linear block codes, the all-zeros vector must be a member of the codeword set in each row ("coset") consisting of an error pattern in the first column (called the "coset leader") followed by the code vector perturbed by that vector pattern. See the Sklar textbook discussed above at page 277, section 5.4.8 for example. Decision block 510 tests e' to determine whether the error identified and corrected by high performance decoder 200 is an error that the existing decoder 72A is capable of correcting (i.e., whether it is a coset leader).

If, in this particular embodiment, existing decoder 72A is capable of correcting the error ("yes" exit to decision block 510), then the process may pass the "raw" (thresholded) binary vector z' to the existing decoder 72A and effectively not use or bypass the decoded output of high performance MLSE decoder 200 altogether (block 516). In this particular instance, since the soft decoder 200 has confirmed that the existing decoder 72A is capable of correcting the error, the additional performance of the MLSE decoder is not needed and the system can rely on the error correction capabilities of the existing decoder.

Thus, in this branch of decision block 510, we can simply let $r'=(2^m-1)z'$ (block 516). The existing decoder 72A receives r'. Its hard decision vector z of r' coincides with z'. Since all the components of r' have the same magnitude, the existing decoder 72A is free to declare erasures anywhere it wants, and that has no effect on the outcome. One of the $2^t$ vectors $z^{(j)}$, say $z^{(o)}$, is z', and its corresponding codeword $y^{(o)}$ is y', since their difference is equal to e', which is a coset leader. Now note that given a constant magnitude r', Euclidean distance is equivalent to Hamming distance. Hence among the $y^{(j)}$'s, $y(0)=y'$ in Euclidean distance, and is chosen by the existing decoder 72A as the output y—and the error estimate is b=b'.

Case 2: e' is not a coset leader and therefore the error is not correctable by the existing decoder In this particular embodiment, if decision block 510 determines that the error corrected by MLSE decoder 200 is not correctable by the existing decoder 72A (i.e., the error is not a coset leader within the standard array model of the existing decoder) ("no" exit to decision block 510), then the embodiment inserts an artificial error pattern into the codeword estimate y' outputted by the MLSE decoder 200. This artificial error pattern is different from the actual error corrected by MLSE decoder 200 in that the artificial error pattern can be corrected by existing decoder 72A (whereas the existing decoder cannot correct the original error).

In this embodiment, the particular artificial error pattern intentionally introduced into the corrected codeword estimate y' outputted by MLSE decoder 200 is such that the reliability estimate produced by the existing decoder upon correcting the error will be as close as possible (within the constraints of the existing decoder 72A) to the number of errors estimate produced by the MLSE decoder 200. In more detail, let T be the largest coset leader weight. If $b' \leq T$, we make e' equal to some coset leader of weight b'. If not, we make e' equal to some coset leader of weight T.

Thus, in this particular example, the artificial error pattern is generated by resetting the e' to be a coset leader within the standard array model of existing decoder 72A (such that it can be corrected by the existing decoder) (block 512). The particular coset leader selected is the one with the largest possible weight less than or equal to the number of errors estimate b' computed by block 508 (block 512). This example then resets the binary vector z' to be equal to the estimated codeword output y' of MLSE decoder 200 summed with the error pattern as reset, i.e.,:

$$z'=y'+e'$$

(block 514). This new z' is then used to calculate the output vector r' by block 516 as before. The existing decoder 72A decodes $z^{(O)}=z'$ into $y(O)=y'$, and outputs $y=y'$ and $b=\min(b',T)$.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of bypassing a decoder that, in use, decodes a received digital signal, said method comprising:
   (1) decoding a received digital signal to produce at least one codeword;
   (2) generating information including error patterns and an error estimate based on decoding step (1); and
   (3) feeding, to said decoder, said error patterns to force the decoder to produce (a) a codeword corresponding to the codeword produced by step (1), and (b) an error estimate corresponding to the error estimate generated by step (2), thereby effectively bypassing said decoder.

2. A method as in claim 1 wherein the decoding step (1) comprises soft decision decoding, and said decoder performs hard decision decoding.

3. A method as in claim 1 wherein feeding step (3) includes the step of conditionally feeding the decoder a signal corresponding to the received digital signal uncorrected by decoding step (1).

4. A method as in claim 1 wherein said step (3) includes generating at least some artificial error patterns based at least in part on the error estimate produced by step (2).

5. A method of decoding a received digital signal comprising:
   (1) decoding a received digital signal to produce at least one codeword;
   (2) generating an error estimate based on decoding step (1); and
   (3) feeding information including said error estimate and said codeword to a further decoding process that forces the further decoding process to produce (a) a codeword corresponding to the codeword produced by step (1), and (b) an error estimate corresponding to the error estimate produced by step (2),
   wherein step (3) includes the step of feeding artificial errors to the further decoding process.

6. A method as in claim 5 further including generating the artificial errors based at least in part on the error estimate produced by step (2).

7. A method of decoding a received digital signal comprising:
   (1) decoding a received digital signal to produce at least one codeword;
   (2) generating an error estimate based on decoding step (1); and (3) feeding information to a further decoding process that forces the further decoding process to produce (a) a codeword corresponding to the codeword produced by step (1), and (b) an error estimate corresponding to the error estimate produced by step (2), wherein step (2) includes the step of determining the number of bit errors, and step (3) includes the step of determining whether the further decoding process can correct the determined number of bit errors.

8. A digital signal decoding arrangement for bypassing a decoder that, in use, decodes a received digital signal, said arrangement comprising:

a first decoder for decoding the received digital signal to produce at least one codeword and for generating an error estimate based on said decoding; and output means coupled to the first decoder for feeding, to a further decoder to be bypassed, information including error patterns that forces the further decoder to produce (a) a codeword corresponding to the codeword produced by the first decoder, and (b) an error estimate corresponding to the error estimate produced by the first decoder, thereby effectively bypassing said further decoder.

9. A decoding arrangement as in claim 8 wherein the decoding arrangement further includes the further decoder.

10. A decoding arrangement as in claim 9 wherein the further decoder includes a circuit that produces, in response to the information fed to it by the outputting means, a codeword equal to the codeword produced by the first decoder.

11. A decoding arrangement as in claim 9 wherein the further decoder includes a circuit that produces, in response to the information fed to it by the outputting means, an error estimate that matches the error estimate produced by the first decoder.

12. A decoding arrangement as in claim 9 wherein the first decoder includes means for making a soft decision, and the further decoder comprises means for making a hard decision.

13. A decoding arrangement as in claim 8 wherein outputting means includes means for conditionally feeding the further decoder a signal corresponding to the received digital signal uncorrected by the first decoder.

14. An arrangement as in claim 8 wherein said output means includes a circuit that generates at least some artificial error patterns based on said generated error estimate.

15. A digital signal decoding arrangement comprising:

a first decoder for decoding the received digital signal to produce at least one codeword and for generating an error estimate; and output means coupled to the first decoder for feeding, to a further decoder, information that forces the further decoder to produce (a) a codeword corresponding to the codeword produced by the first decoder, and (b) an error estimate corresponding to the error estimate produced by the first decoder, wherein the decoding arrangement further includes the further decoder, and wherein the further decoder produces, in response to the information fed to it by the outputting means, an error estimate that is the minimum of: (i) the error estimate produced by the first decoder, and (ii) the largest corresponding coset leader weight of the further decoder.

16. A digital signal decoding arrangement comprising:

a first decoder for decoding the received digital signal to produce at least one codeword and for generating an error estimate; and output means coupled to the first decoder for feeding, to a further decoder, information including said error estimate and said code word that forces the further decoder to produce (a) a codeword corresponding to the codeword produced by the first decoder, and (b) an error estimate corresponding to the error estimate produced by the first decoder, wherein the outputting means includes means for feeding artificial errors to the further decoder.

17. A decoding arrangement as in claim 16 wherein the outputting means further includes means for generating the artificial errors based at least in part on the error estimate produced by the first decoder.

18. A digital signal decoding arrangement comprising:

a first decoder for decoding the received digital signal to produce at least one codeword and for generating an error estimate; and output means coupled to the first decoder for feeding, to a further decoder, information that forces the further decoder to produce (a) a codeword corresponding to the codeword produced by the first decoder, and (b) an error estimate corresponding to the error estimate produced by the first decoder, wherein the first decoder includes means for detecting errors, and the output means includes means for determining whether the further decoder can correct the detected errors.

19. In a radio communications system having a demodulator, an existing channel decoder that produces a decoded received signal output and an error estimate, and a speech decoder that expands the received signal output to recover a digitized voice data stream based at least in part on the error estimate, a method for upgrading the radio communications system by supplying a further channel decoder and effectively bypassing the existing channel decoder without removing the existing channel decoder from the system, said method comprising the step of inserting, between the demodulator and the channel decoder, a further channel decoder that:

(a) detects and corrects errors in the demodulator's output, and (b) provides information including error patterns to the existing detector that forces the existing channel decoder to provide the speech decoder with an error estimate that corresponds to the errors corrected by the further channel decoder, thereby effectively bypassing said further channel decoder.

20. A method as in claim 19 wherein step (b) includes generating at least some artificial error patterns based on said error estimate.

21. A radio communications system comprising:

a demodulator, a first channel decoder that produces a decoded received signal output and an error estimate, a speech decoder, connected to receive the decoded received signal output and the error estimate, that expands the decoded received signal output to recover a digitized voice data stream based at least in part on the error estimate, and a further channel decoder connected between the demodulator and the first channel decoder, the further channel decoder including:

a channel decoder arrangement that detects and corrects at least some errors in the demodulator's output that the first channel decoder cannot correct, and an output circuit connected to the channel decoder arrangement that provides information including error patterns to the first channel decoder forcing the first channel decoder's error estimate to reflect the errors corrected by the further channel decoder, thereby effectively bypassing said first channel decoder.

22. A radio communications system comprising:

a demodulator, a first channel decoder that produces a decoded received signal output and an error estimate, a speech decoder, connected to receive the decoded received signal output and the error estimate, that expands the decoded received signal output to recover a digitized voice data stream based at least in part on the error estimate, and a further channel decoder connected between the demodulator and the first channel decoder, the further channel decoder including:

a channel decoder arrangement that detects and corrects at least some errors in the demodulator's output that the first channel decoder cannot correct, and an output circuit connected to the channel decoder arrangement that provides information to the first detector forcing the first channel decoder's error estimate to reflect the errors corrected by the further channel decoder, wherein the output circuit includes means for routing the demodulator's output to the first decoder if the first decoder can correct all errors contained in the demodulator's output.

23. A digital receiver method comprising:

(a) receiving an RF signal;

(b) demodulating the received RF signal to provide a received digital signal;

(c) performing maximum likelihood sequence estimate channel decoding on the received digital signal to produce at least one error-corrected codeword;

(d) generating an error correction estimate based on step (c);

(e) producing an artificial received digital signal, based on the error correction estimate, that contains error information that will force a further decoding step (f) to produce the error-corrected codeword and a further error correction estimate that corresponds to the error correction estimate generated by step (d); and (f) channel decoding and speech decoding the artificial received digital signal.

24. A method as in claim 23 wherein step (e) includes the step of intentionally introducing at least one artificial error pattern into the codeword, and step (f) includes the step of detecting and correcting the artificial error pattern.

* * * * *